United States Patent [19]

Balke

[11] Patent Number: 4,574,719

[45] Date of Patent: Mar. 11, 1986

[54] OPTOELECTRONIC SCANNER FOR SEWING MACHINE

[75] Inventor: Siegmund Balke, Spenge, Fed. Rep. of Germany

[73] Assignee: Durkoppwerke GmbH, Bielefeld, Fed. Rep. of Germany

[21] Appl. No.: 625,119

[22] Filed: Jun. 27, 1984

[30] Foreign Application Priority Data

Jun. 28, 1983 [DE] Fed. Rep. of Germany ....... 3323214

[51] Int. Cl.$^4$ .............................................. D05B 35/00
[52] U.S. Cl. .................................... 112/272; 112/277; 250/548
[58] Field of Search ............... 112/104, 271, 272, 277, 112/303; 250/548, 557

[56] References Cited

U.S. PATENT DOCUMENTS

| 3,867,889 | 2/1975 | Conner, Jr. ............ 250/548 X |
| 4,038,931 | 8/1977 | Kosrow et al. ............ 112/272 |
| 4,359,953 | 11/1982 | Martell et al. ............ 112/275 X |
| 4,370,059 | 1/1983 | Masuda ............ 250/548 X |
| 4,403,558 | 9/1983 | Martell et al. ............ 112/275 X |

FOREIGN PATENT DOCUMENTS 3043852 7/1982 Fed. Rep. of Germany .
1172430 2/1959 France ................ 112/303

Primary Examiner—Wm. Carter Reynolds
Attorney, Agent, or Firm—Karl F. Ross; Herbert Dubno

[57] ABSTRACT

A workpiece fed to a stitching point of a sewing machine, consisting of one or more layers of fabric, is transluminated by a source of visible or infrared radiation which is intercepted by two photoelectric sensors following each other in the direction of motion. The sensors work into respective radiation/frequency converters whose output voltages, after rectification, are compared in a window discriminator to provide an indication of the passage of a leading or trailing edge of a fabric layer manifesting itself in a jump in one of the voltages. The jump is intensified by a threshold circuit in each converter, comprising a Zener diode which for highly light-transmissive fabric layers can be short-circuited by an optocoupler.

9 Claims, 4 Drawing Figures

FIG. 2
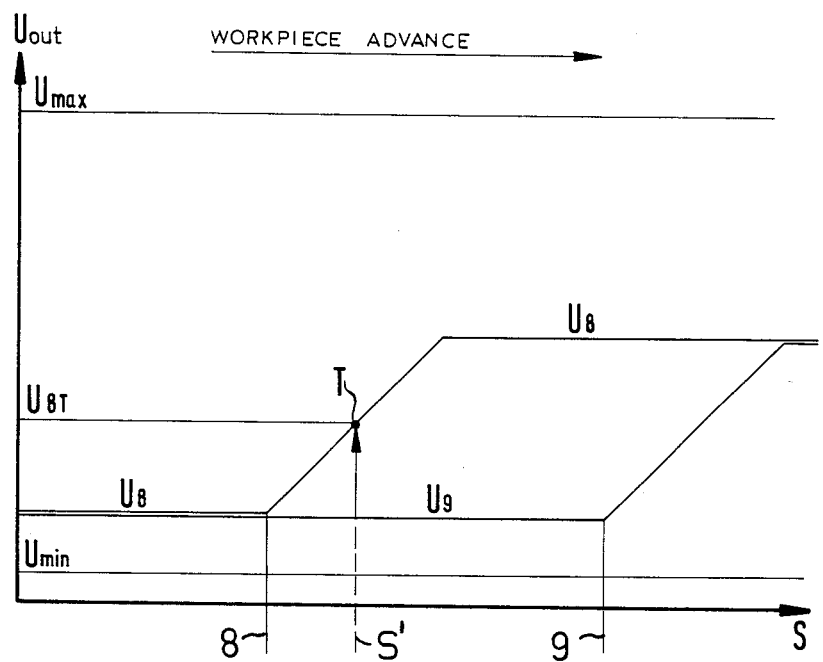
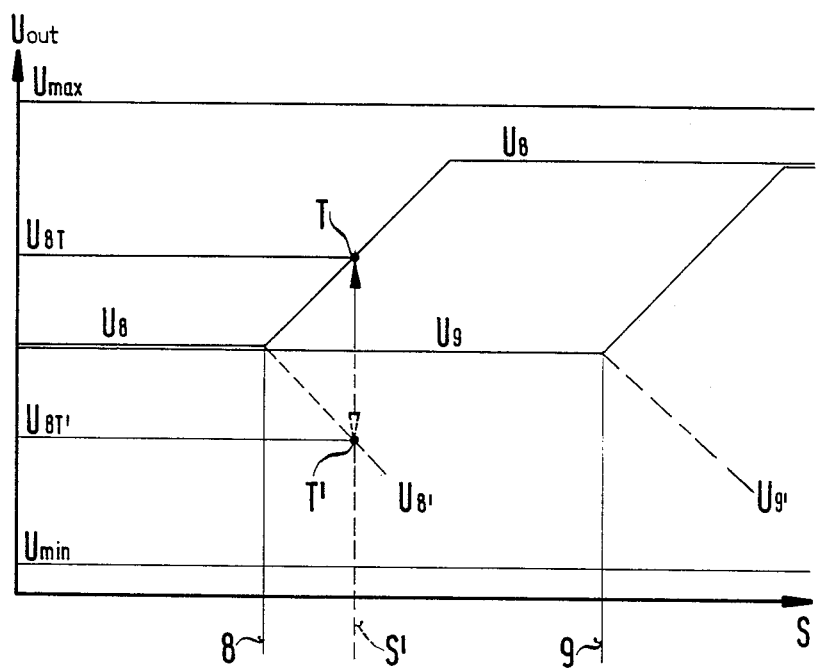
FIG. 3

OPTOELECTRONIC SCANNER FOR SEWING MACHINE

FIELD OF THE INVENTION

My present invention relates to an optoelectronic scanner to be used with a sewing machine in order to detect significant thickness changes in a workpiece moving toward a stitching point, especially changes due to the passage of a leading or trailing edge of a fabric layer forming part of that workpiece.

BACKGROUND OF THE INVENTION

The photoelectric monitoring of thickness variations of a fabric is known, for example, from German laid-open specification DE 30 43 852 A1, published July 1, 1982, according to which a textile web is transluminated by several elongate lamps extending across its width as it passes thereover from a supply roll to a take-up roll. Three focusing objectives lying in a row above the web path receive the emitted light by way of slot diaphragms and project images of the transluminated web portions upon three line-scanning photodiodes whose output signals are fed, via shift registers and preamplifiers, to inverting inputs of a pair of differential amplifiers with noninverting inputs having adjustable threshold voltages applied thereto. The system generates two trains of pulses whose width and relative spacing are determined by the separation of the consecutively scanned textile threads so that their integrated values are a measure of thread density. That system does not enable an automatic threshold adjustment on the recognition of thickness variations due to partial superposition of several fabric layers.

OBJECTS OF THE INVENTION

The general object of my present invention is to provide an optoelectronic scanner for a sewing machine which responds rapidly to a change in the number of fabric layers approaching the stitching point of the machine, e.g. for the purpose of detecting the location of a label whose affixation to the main fabric requires a modification of the sewing operation.

Another object is to provide a scanner of this character responsive to relative rather than absolute density changes in order to detect leading and trailing edges of additional layers overlying bottom layers of different densities.

SUMMARY OF THE INVENTION

An optoelectronic scanner according to my present invention comprises a source of photoelectrically detectable radiation, which could be visible light or infrared rays, positioned upstream of the stitching point of a sewing machine for transluminating a workpiece approaching that point on a supporting surface, preferably through an aspherical (cylindrical) lens having an axis transverse to the direction of workpiece motion. A first and a second photoelectric sensor, spaced apart in the direction of workpiece motion, receive that radiation after its passage through the workpiece. These sensors are respectively connected to a first and a second radiation/frequency converter which translates their resistances into pulse trains whose cadences or repetition frequencies vary with the magnitudes of these resistances and thus with the incident radiation. The converters work into discriminating means for signaling significant variations in the relative values of the generated oscillations to a human operator or to an evaluator automatically changing the stitching mode of the machine.

While various circuit arrangements could serve as the discriminating means, I prefer to use a conventional window discriminator to which the pulse trains generated by the converters are transmitted after rectification and integration. The voltage spread of such a discriminator, corresponding to the maximum separation of the two generated repetition frequencies not interpreted as a change in the number of transluminated layers, may be readily adjusted with the aid of a potentiometer.

Pursuant to another feature of my invention, each voltage/frequency converter includes a capacitor which is chargeable through an amplifier controlled by the respective sensor and can be quickly discharged under the control of a timer upon reaching a predetermined charging voltage, thereby giving rise to a sawtooth voltage of variable frequency from which a train of rectangular pulses of variable width and uniform spacing is derived. Advantageously, the capacitor has a charging circuit divided into two parallel branches, one of them containing the amplifier while the other contains resistance means in series with the associated sensor; the amplifier has an input circuit connected across the resistance means. A Zener diode forming part of the resistance means enables the charging current to flow mainly through one or the other branch, depending on the state of conductivity of that diode, so as to provide an extended current range which exceeds the range of linear operation of the amplifier and is divided into two distinct subranges. During a discharge phase, the timer grounds or otherwise disables the charging circuit. A third subrange can be added with the aid of a switch, preferably comprising an optocoupler, for selectively short-circuiting the Zener diode. The switch may be closed manually or automatically, the latter for example by a digital evaluator responding to a pulse-repetition frequency surpassing a certain numerical limit indicative of highly translucent layers of a monitored workpiece so that the output voltages of a sensor overlain by one or more of these layers differ but slightly from one another; this restores the linear mode of operation of the amplifier and leads to a wider divergence of the resulting exponential charging rates.

BRIEF DESCRIPTION OF THE DRAWING

The above and other features of my invention will now be described in detail with reference to the accompanying drawing in which:

FIGS. 2 and 3 are graphs showing scanning signals plotted against the advance of the workpiece for two distinct layer densities.

SPECIFIC DESCRIPTION

Figure 1:
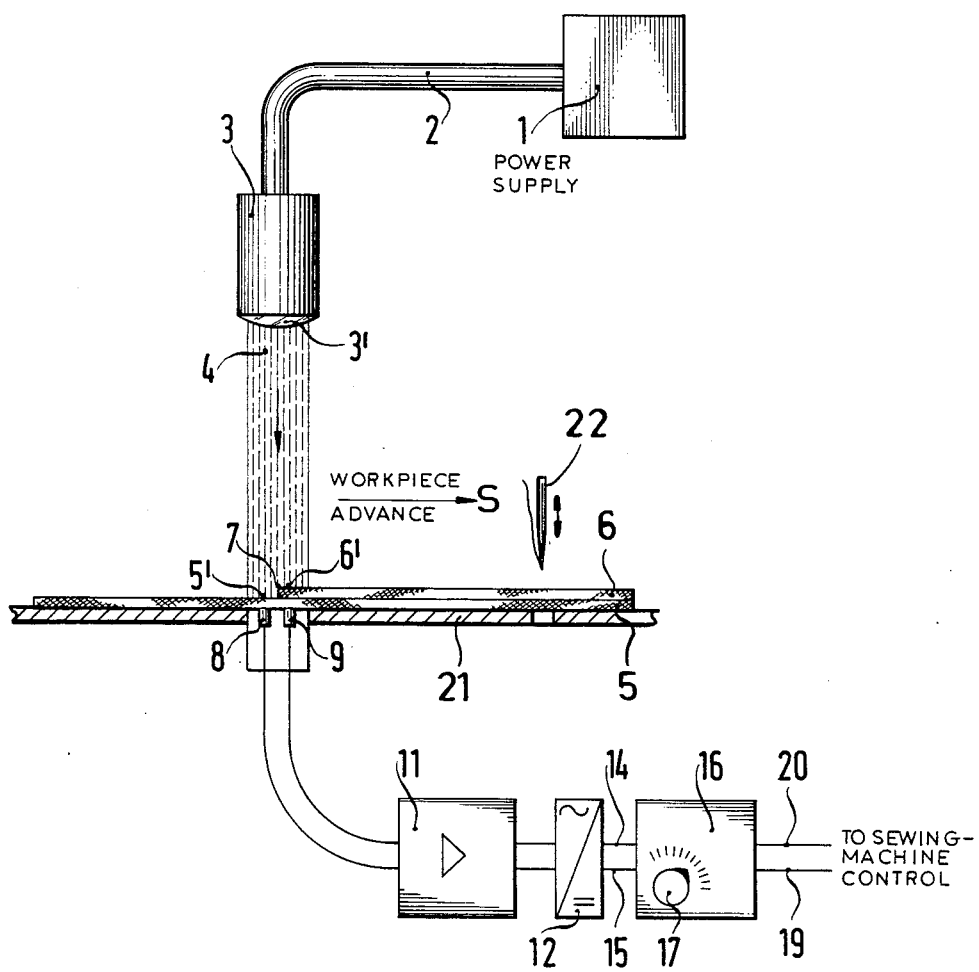
FIG. 1 is a somewhat diagrammatic elevational view of an optoelectronic scanning system according to my invention coacting with a multilayer fabric upstream of a stitching point on a sewing machine.

As shown in FIG. 1, a power supply 1 energizes via a cable 2 an emitter 3 of visible light or infrared radiation which is focused by an aspherical lens 3' into a generally cylindrical beam 4 trained from above upon a stitch plate 21 of a sewing machine of which only a vertically reciprocating needle 22 has been illustrated. A workpiece transported on plate 21 by the usual feed dogs (not shown) comprises a bottom layer 5 and a shorter top layer 6 of textile fabric moving continuously past the stitching point defined by needle 22. In the illustrated position, a trailing edge 7 of fabric layer 6 lies between two photoelectric sensors 8 and 9, such as conventional photodiodes, phototransistors or photoresistors, which are disposed below plate 21 on opposite sides of the midplane of beam 4 to intercept the radiation transluminating the workpiece. More particularly, rays impinging on an area 5' of layer 5 reach the upstream sensor 8 whereas rays impinging on an area 6' of layer 6 reach the downstream sensor 9. These areas 5' and 6' may extend over the full width of the workpiece whose path of motion has been designated S.

Figure 4:
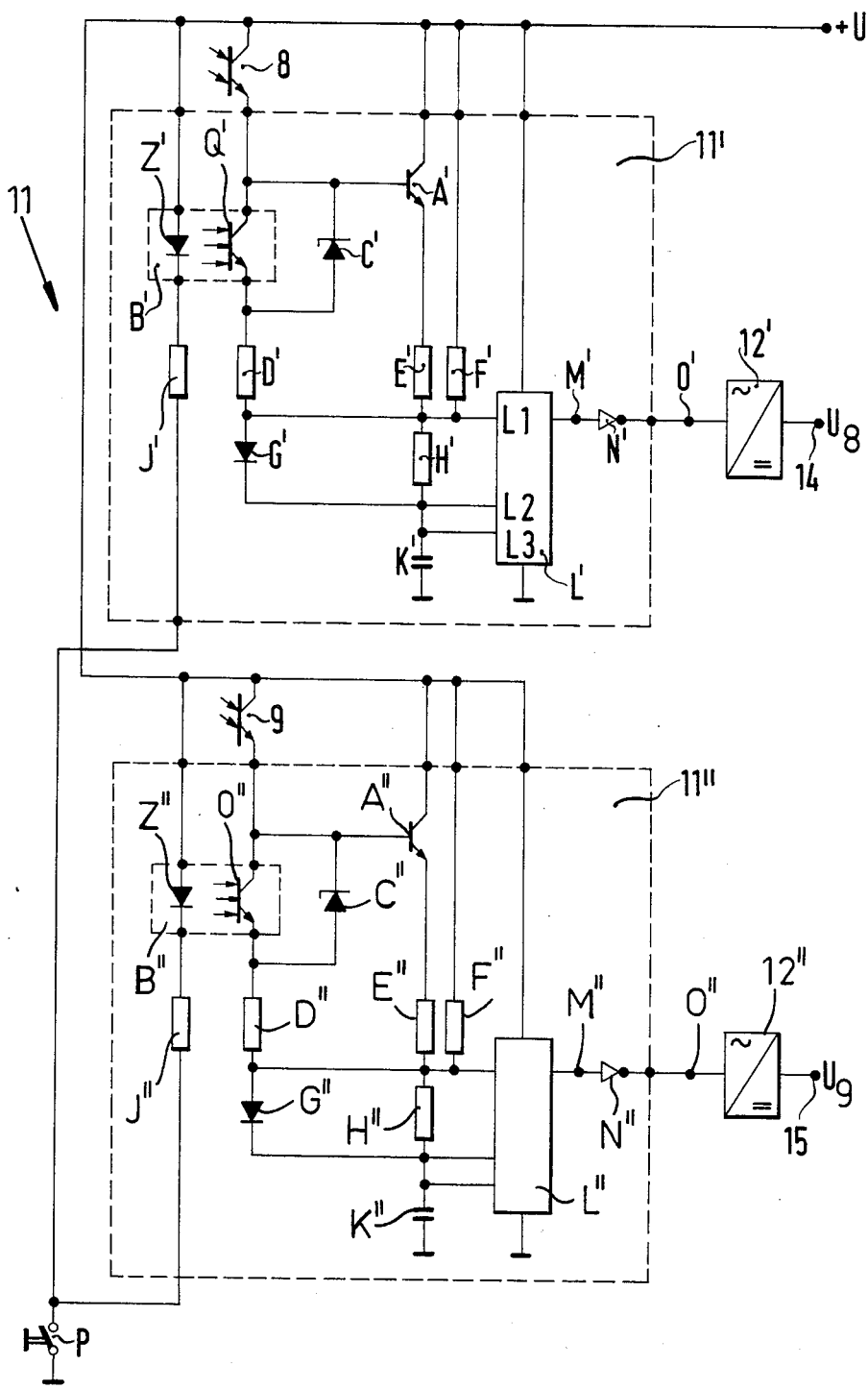
FIG. 4 is a circuit diagram showing details of two voltage/frequency converters generating the scanning signals of FIGS. 2 and 3.

The outputs of sensors 8 and 9 are connected to respective inputs of a conversion unit 11 divided into two mutually identical sections 11' and 11" as shown in FIG. 4. Pulse trains generated by these two sections, as described hereinafter, are rectified in a network 12 also divided into two sections 12' and 12" (FIG. 4). The two rectifier sections have respective output leads 14 and 15 connected to a window discriminator 16 whose bandwidth can be adjusted by means of a potentiometer 17 as noted above. Output leads 19 and 20 of discriminator 16 extend to an evaluator, not shown, which controls the operation of the sewing machine according to the relative magnitudes of the potentials of leads 14, 15.

As shown in FIG. 4, converters 11' and 11" forming part of unit 11 are inserted in parallel between a supply of positive voltage +U and ground. Sensors 8 and 9 in series with these converters are shown as NPN phototransistors with collectors connected to supply +U and emitters tied to the bases of respective NPN transistors A' and A". The latter transistors, with collectors also connected to supply +U, have emitters connected by way of resistors E' and E", in series with low-ohmic resistors H' and H" shunted by diodes G' and G", to an ungrounded plate of a respective low-leakage capacitor K' and K" whose opposite plate is grounded. A high-ohmic resistor F' and F" shunts the series combination of transistors A', A" and resistors E', E" to provide a constant minimum charging current for capacitor K' or K". The transistors A', A" constitute amplifier means controlled by the respective sensors 8, 9. The base/emitter circuits of these transistors, including resistors E' and E", are shunted by series combinations of respective Zener diodes C' and C" with associated resistors D' and D". An optocoupler B' comprises a light-emitting diode Z' juxtaposed with another phototransistor Q' shunting the Zener diode C'; analogously, Zener diode C" is shunted by a phototransistor Q" juxtaposed a LED Z" forming part of another optocoupler B". LEDs Z' and Z" are connected, in series with respective ballast resistors J' and J", between supply +U and a normally ungrounded bank contact of a manual switch P having a grounded armature.

Each converter 11', 11" further comprises a timer L', L", advantageously consisting of CMOS modules to minimize interference with the charging currents, which lies between supply +U and ground and, as particularly shown for element L', has three input terminals L1, L2, L3 and an output terminal M' (M" in the case of element L"). Terminal L1 is tied to the junction of diodes G', G" with charging resistors D', E', F' or D", E", F" while the other two are joined to the ungrounded capacitor plate. Each timer is designed as an astable multivibrator which is triggered when the capacitor voltage fed to terminal L2 reaches a certain upper limit—e.g. $+2U/3$—and thereupon grounds its terminal L1 to close a discharge circuit for the capacitor by way of resistor H'. When the capacitor voltage drops to a lower limit—e.g. $+U/3$—detected by terminal L3, the timer returns to normal; since capacitors K', K" and resistors H', H" form networks of fixed time constant, and since the grounding of terminal L1 also prevents the passage of charging current through diodes G', G" from any circuit branch, the off-normal period of the timer is of invariable duration—on the order of 1 $\mu s$—and defines a rectangular pulse on terminals M' and M" separating two intervals whose length corresponds to the variable charging period of the respective capacitor. Terminals M' and M" are connected via respective inverting amplifiers N' and N", designed as voltage-level converters, to inputs O' and O" of the associated rectifier sections 12' and 12" which integrate their positive pulse trains to produce signal voltages $U_8$ and $U_9$ on leads 14 and 15, respectively. Switch P, common to both converters, may lie anywhere within convenient reach of the operator.

The repetition frequencies or cadences of the pulse trains appearing on terminals M' and M" preferably lie in a range of about 1 to 500 KHz, with the lower limiting frequency existing when the corresponding sensor 8 or 9 is completely obscured whereas the upper frequency limit applies to a directly illuminated sensor. The lower limiting frequency, taking leakages of the capacitor and of terminal L1 into account, is generated in the nonconductive state of sensors 8 or 9 (with transistors A' and A" cut off) by a trickle current through high-ohmic resistors F' and F" slowly charging the capacitors K' and K" via diodes G' and G", respectively. With either sensor moderately illuminated, e.g. by way of the two stacked fabric layers 5 and 6 shown in FIG. 1, the corresponding capacitor K' or K" is charged—mainly through the circuit branch including transistor A' or A" in series with resistor E' or E"—at a rate depending on the intensity of illumination. When the upper fabric layer 6 disappears, i.e. when its trailing edge 7 clears the respective sensor, the current through that branch may not increase significantly because of transistor saturation but the larger output voltage on the emitter of phototransistor 8 or 9 may simultaneously cause the Zener diode C' or C" to break down whereby an intensified charging current flows mainly through the branch including that Zener diode and its series resistor D' or D". In any event, there occurs at this point a distinct jump in the repetition frequency of the pulse train appearing on terminal M' or M" and consequently in the signal voltage $U_8$ or $U_9$.

This has been illustrated in FIGS. 2 and 3 showing output voltages $U_{out}$ of converters 11' and 11" plotted against the motion of the workpiece along its path S. Voltages $U_{max}$ and $U_{min}$ given in these graphs correspond to the upper and lower frequency limits referred to above.

The graph of FIG. 2 pertains to a workpiece whose layers 5, 6 are of substantially identical, relatively low translucency; in FIG. 3 it has been assumed that the lower layer 5 is considerably more light-transmissive than the upper layer 6. With the workpiece moving in the direction S, both layers initially overlie the two sensors 8 and 9 so as to give rise in FIG. 2 to relatively low signal voltages $U_8$ and $U_9$ of like magnitude. When the workpiece reaches the position of FIG. 1, with edge 7 lying at a location S' where it clears the sensor 8 but not the sensor 9, the signal voltage $U_8$ of converter 11' (FIG. 4) rises past a level $U_{8T}$ corresponding to a deviation by a threshold T from the still unmodified voltage $U_9$ serving as a reference level; threshold T is given by the voltage spread of window discriminator 16 set by potentiometer 17 (FIG. 1). Discriminator 16 thereupon emits on its input 19 a control signal which disappears after edge 7 also has passed the sensor 9 so that the signal voltage $U_9$ of converter 11'' rejoins the voltage $U_8$.

If the lower layer 5 has the higher translucency assumed in connection with FIG. 3, signal voltages $U_8$ and $U_9$ start out at a higher value. The threshold T has been correspondingly elevated so that level $U_{8T}$ is again attained at the instant when fabric edge 7 passes the location S'. With upper layer 6 assumed to have the same density as before, the resulting steep rise in the charging current and therefore in signal voltage $U_8$ above level $U_{8T}$ produces a control signal on discriminator output 19 which disappears when voltage $U_9$ follows suit.

Obviously, the arrival of a leading edge of an upper fabric layer above sensors 8 and 9 will have the opposite result, causing signal voltage $U_8$ to deviate downward from reference voltage $U_9$ and to drop below a level $U_{8T}$, corresponding to a threshold T' (FIG. 3) still given by the window breadth or voltage spread of discriminator 16; this gives rise to a control signal on discriminator output 20, disappearing when the arriving fabric edge covers sensor 9. In all these cases, as seen in FIGS. 2 and 3, the control signal is emitted at practically the same position of the detected edge.

If in a given situation the discriminator window is so wide that voltage changes due to the passage of a leading or trailing edge are ignored, or is so narrow that inherent density variations of a layer are misinterpreted as a change in the number of layers, the window will have to be adjusted with the aid of potentiometer 17. In these cases the location of detection point S' will be shifted but the mode of operation will otherwise remain the same.

Switch P may be closed when, say, layers 5, 6 are so highly translucent that sensors 8, 9 operate in a state of near saturation. Such switch closure energizes the LEDs Z' and Z'' and starts the phototransistors Q' and Q'', thereby short-circuiting the Zener diodes C' and C''. This eliminates the previously existing voltage drop across the Zener diodes—which under the circumstances assumed above will have to be less than $+U/3$—and lowers the base voltages of transistors A' and A'' which therefore return to their linear mode of operation.

The choice of about 1 KHz as a lower frequency limit is dictated by the fact that switchover periods of a sewing-machine mechanism generally lie in a range of about 10 to 20 ms so that pulse cycles of more than 1 ms will not be suitable.

The maximum emission of radiation generator 3 (FIG. 1) ought to correspond to the maximum sensitivity of phototransistors 8 and 9.

The advantages of conversion unit 11 over conventional analog networks using high-gain operational amplifiers may be summarized as follows:

(a) It provides a high degree of safety from interferences.

(b) The output signals appearing at points M', M'' and O', O'' can be digitally processed and faithfully transmitted over large distances; their storage is no problem.

(c) Analog processing of the signals at points O', O'' is also possible, as in the described embodiment.

(d) Relatively few components are required.

I claim:

1. In a sewing machine provided with a supporting surface over which workpieces consisting of a variable number of superposed fabric layers are fed to a stitching point,
   the combination therewith of an optoelectronic scanner for detecting leading and trailing edges of fabric layers moving toward the stitching point, said scanner comprising:
   a source of photoelectrically detectable radiation positioned upstream of said stitching point for transluminating an oncoming workpiece;
   a first and a second photoelectric sensor spaced apart in the direction of workpiece motion and disposed to receive said radiation after passage thereof through the oncoming workpiece;
   a first and a second radiation frequency converter respectively connected to said first and second sensor for translating their resistances into pulse trains of repetition frequencies varying with the magnitudes of said resistances;
   discriminating means connected to said converters for signaling significant changes in the relative values of said repetition frequencies; and
   rectifying means inserted between said converters and said discriminating means, said discriminating means comprising an adjustable window discriminator, said source including an aspherical lens with an axis transverse to the direction of workpiece motion.

2. The combination defined in claim 1 wherein each of said converters comprises a capacitor chargeable through amplifier means controlled by the respective sensor and timing means for discharging said capacitor upon attainment of a predetermined charging voltage.

3. In a sewing machine provided with a supporting surface over which workpieces consisting of a variable number of superimposed fabric layers are fed to a stitching point,
   the combination therewith of an optoelectronic scanner for detecting leading and trailing edges of fabric layers moving toward the stitching point, said scanner comprising:
   a source of photoelectrically detectable radiation positioned upstream of said stitching point for transluminating an oncoming workpiece;
   a first and second photoelectric sensor spaced apart in the direction of workpiece motion and disposed to receive said radiation after passage thereof through the oncoming workpiece;
   a first and a second radiation frequency converter respectively connected to said first and second sensors for translating their resistances into pulse trains of repetition frequencies varying with the magnitudes of said resistances; and
   discriminating means connected to said converters for signaling significant changes in the relative values of said repetition frequencies, each of said converters comprising a capacitor chargeable through amplifier means controlled by the respective sensor and timing means for discharging said capacitor upon attainment of a predetermined charging voltage, said capacitor having a charging circuit including two parallel branches, one of said branches containing said amplifier means, the other of said branches containing resistance means in series with the respective sensor, said amplifier means having an input circuit connected across said resistance means.

4. The combination defined in claim 3 wherein said resistance means includes a Zener diode.

5. The combination defined in claim 4, further comprising switch means selectively operable to short-circuit said Zener diode.

6. The combination defined in claim 5 wherein said switch means includes an optocoupler.

7. The combination defined in claim 3 wherein said charging circuit further includes a third parallel branch comprising a high-ohmic resistor.

8. The combination defined in claim 3 wherein said charging circuit is disabled by said timing means during a discharge period thereof.

9. In an optoelectronic scanner for a sewing machine for the precise determination of thickness differences of movable multilayer fabric workpieces in which a transmitter sends electromechanic radiation through the workpiece to fall upon a plurality of ferroelectric sensors so that signals are generated corresponding to the transmitted electromagnetic radiation and are fed to an amplifier, the improvement wherein:

the transmitter is disposed above said workpiece and is provided with an aspherical lens from which said electromagnetic radiation is emitted;

said photoelectric sensors are optoelectronic sensors of which at least two are provided below a transport path for the workpiece opposite said transmitter;

outputs from said optoelectronic sensors are applied to two identically constructed radiation/frequency converters;

respective but identical rectifiers are connected to output sides of each of said converters; and output voltages from said rectifiers are applied to an adjustable window discriminator having a potentiometer for setting the window width thereof.

* * * * *